United States Patent
Yokai et al.

(10) Patent No.: US 8,179,691 B2
(45) Date of Patent: May 15, 2012

(54) WIRED CIRCUIT BOARD

(75) Inventors: Takahiko Yokai, Osaka (JP); Tetsuya Ohsawa, Osaka (JP); Yasunari Ooyabu, Osaka (JP)

(73) Assignee: NITTO DENKO Corporation, Osaka (JP)

( * ) Notice: Subject to any disclaimer, the term of this patent is extended or adjusted under 35 U.S.C. 154(b) by 554 days.

(21) Appl. No.: 12/318,689

(22) Filed: Jan. 6, 2009

(65) Prior Publication Data

US 2009/0173521 A1    Jul. 9, 2009

Related U.S. Application Data

(60) Provisional application No. 61/006,602, filed on Jan. 23, 2008.

(30) Foreign Application Priority Data

Jan. 7, 2008 (JP) .................................. 2008-000746

(51) Int. Cl.
*H05K 7/00* (2006.01)

(52) U.S. Cl. ........ 361/777; 361/778; 361/748; 174/255; 174/250

(58) Field of Classification Search .................. 174/250, 174/253, 255, 258, 261; 361/777, 778, 748–751, 361/728

See application file for complete search history.

(56) References Cited

U.S. PATENT DOCUMENTS

| | | | |
|---|---|---|---|
| 5,737,152 A | 4/1998 | Balakrishnan | |
| 5,796,552 A | 8/1998 | Akin, Jr. et al. | |
| 5,995,328 A | 11/1999 | Balakrishnan | |
| 6,218,631 B1* | 4/2001 | Hetzel et al. | 174/261 |
| 7,092,215 B2 | 8/2006 | Someya et al. | |
| 2002/0148637 A1* | 10/2002 | Anstrom et al. | 174/255 |
| 2003/0116343 A1* | 6/2003 | Adachi et al. | 174/254 |
| 2004/0070884 A1* | 4/2004 | Someya et al. | 360/245.9 |
| 2005/0056455 A1* | 3/2005 | Masu et al. | 174/117 FF |
| 2005/0195585 A1* | 9/2005 | Lauffer et al. | 361/794 |
| 2006/0076668 A1* | 4/2006 | Kim | 257/691 |
| 2009/0223707 A1* | 9/2009 | Karikalan et al. | 174/261 |

FOREIGN PATENT DOCUMENTS

| | | |
|---|---|---|
| CN | 1780524 A | 5/2006 |
| JP | 08-264911 | 10/1996 |
| JP | 10-125023 | 5/1998 |
| JP | 2004-133988 | 4/2004 |

* cited by examiner

*Primary Examiner* — Hoa C Nguyen (74) *Attorney, Agent, or Firm* — Jean C. Edwards, Esq.; Edwards Neils PLLC (57) ABSTRACT

A wired circuit board includes a first insulating layer; a first wire formed on the first insulating layer; a second insulating layer formed on the first insulating layer so as to cover the first wire; and a second wire formed on the second insulating layer so as to be arranged in opposed relation to the first wire in a thickness direction. The thickness of the first wire is 1 μm or less and is ⅓ or less of the thickness of the second insulating layer.

5 Claims, 5 Drawing Sheets

WIRED CIRCUIT BOARD

CROSS-REFERENCE TO RELATED APPLICATIONS

This application claims the benefit of U.S. Provisional Application No. 61/006,602, filed Jan. 23, 2008, and claims priority from Japanese Patent Application No. 2008-000746, filed Jan. 7, 2008, the contents of which are herein incorporated by reference in their entirety.

BACKGROUND OF THE INVENTION

1. Field of the Invention

The present invention relates to a wired circuit board. More particularly, the present invention relates to a wired circuit board such as a suspension board with circuit, a flexible wired circuit board, or a multi-layered wired circuit board.

2. Description of Related Art

In recent years, in order to correspond to higher wiring density, wired circuit boards such as a suspension board with circuit and a flexible wired circuit board, have been known to have, as a wiring structure, a double-decker structure such that one wire is arranged in opposed relation to another wire while an insulating layer is interposed between these wires in their thickness direction.

For example, in order to suppress the occurrence of crosstalk in the conductive layer, there has been proposed a suspension for discs, including a second layer (lower-side insulating layer) of an insulating layer, a second conductor (lower-side conductor) formed thereon, a first layer (upper-side insulating layer) of the insulating layer which covers them, and a first conductor (upper-side conductor) formed so as to be arranged in opposed relation to the second conductor in the thickness direction of the insulating layer (cf. for example, Japanese Unexamined Patent Publication No. 2004-133988).

SUMMARY OF THE INVENTION

In the suspension for discs proposed in Japanese Unexamined Patent Publication No. 2004-133988, the lower-side conductor is formed relatively thick as compared to the upper-side insulating layer (specifically, approximately half the thickness of the lower-side insulating layer).

Therefore, a significant level difference corresponding to the lower-side conductor tends to occur at both the widthwise ends of the lower-side conductor in the upper-side insulating layer. This disadvantageously results in occurrence of unevenness in the suspension for discs.

In order to prevent the occurrence of such unevenness, the upper-side insulating layer may be thickened. The thicker upper-side insulating layer, however, produces a thicker suspension for discs, failing to achieve a thinner shape.

Further, in the double-decker structure, when the upper-side conductor is formed on the upper-side insulating layer having such level difference produced so as to be opposed to the lower-side conductor in the thickness direction of the insulating layer, the level difference can cause the upper-side conductor to become misaligned, which may impair the accuracy of the arrangement of the upper-side conductor. This results in unstable impedance of the lower-side conductor and the upper-side conductor.

It is an object of the present invention to provide a wired circuit board capable of achieving a flat and thinner shape, and of stabilizing the impedance of the first wire and the second wire.

The wired circuit board of the present invention includes a first insulating layer; a first wire formed on the first insulating layer; a second insulating layer formed on the first insulating layer so as to cover the first wire; and a second wire formed on the second insulating layer so as to be arranged in opposed relation to the first wire in a thickness direction, in which the thickness of the first wire is 1 μm or less and is ⅓ or less of the thickness of the second insulating layer.

In this wired circuit board, since the thickness of the first wire is 1 μm or less and is ⅓ or less of the thickness of the second insulating layer, the second insulating layer is formed flat but not formed thick. Therefore, the wired circuit board can achieve a flat and thinner shape.

Further, the formation of the second wire on the flat second insulating layer can improve the accuracy of the arrangement of the second wire. As a result, the impedance of the first wire and the second wire can be reliably stabilized.

In the wired circuit board of the present invention, it is preferable that a plurality of the first wires are provided so as to be spaced apart in parallel relation, and a spacing between each of the first wires is longer than a width of each of the first wires.

When the spacing between each of the first wires is longer than the width of each of the first wires, a level difference tends to be produced in the second insulating layer. In this wired circuit board, since the first wire has the above-specified thickness and the thickness of the first wire and the thickness of the second insulating layer have the above-specified relationship, the occurrence of the level difference in the second insulating layer can be prevented, thereby enabling the second insulating layer to be formed flat.

In the wired circuit board of the present invention, it is preferable that the first wires are formed by physical vapor deposition.

In this wired circuit board, the formation of the first wires by physical vapor deposition enables the first wires to have the above-specified thickness.

It is preferable that the wired circuit board of the present invention further includes at least one insulating layer formed on the second insulating layer so as to cover the second wire; and at least one wire formed on the insulating layer, in which the wire is arranged in opposed relation to the second wire in a thickness direction.

When the wired circuit board is multi-layered by further forming an insulating layer and a wire, a level difference tends to be produced in the insulating layer. In this wired circuit board, since the first wire has the above-specified thickness and the thickness of the first wire and the thickness of the second insulating layer have the above-specified relationship, the occurrence of the level difference in the insulating layer can be prevented, thereby enabling the insulating layer to be formed flat.

BRIEF DESCRIPTION OF THE DRAWINGS

FIG. 3 is another process diagram for explaining the step (c) of forming first wires on the insulating base layer, in the method for producing a suspension board with circuit shown in FIG. 2, (a) showing the step of forming a first conductive layer over the entire upper surface of the insulating base layer;

(b) showing the step of forming a first etching resist on the first conductive layer, (c) showing the step of etching the first conductive layer exposed from the first etching resist, and (d) showing the step of removing the first etching resist;

DETAILED DESCRIPTION OF PREFERRED EMBODIMENTS

Figure 1:
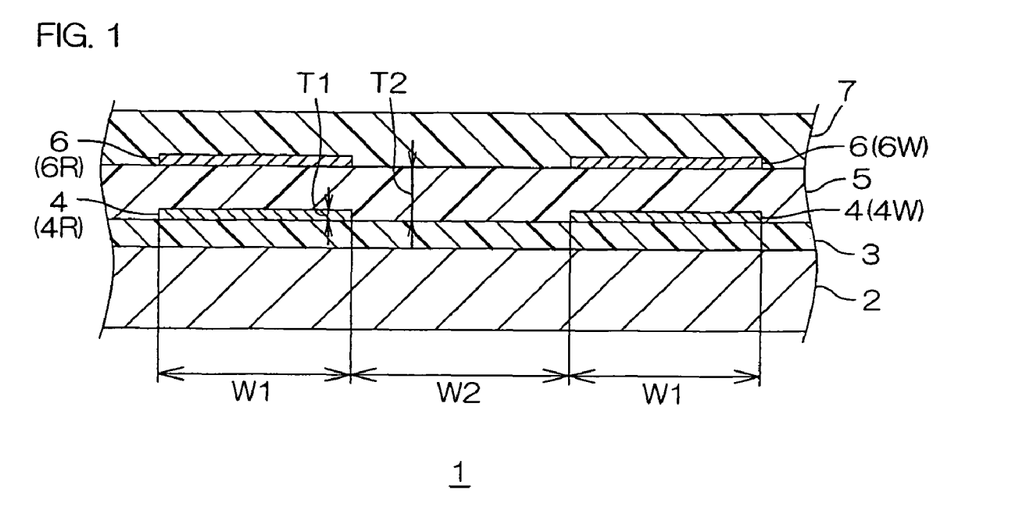
FIG. 1 is a sectional view illustrating a main portion of one embodiment of a wired circuit board according to the present invention.
Figure 2:
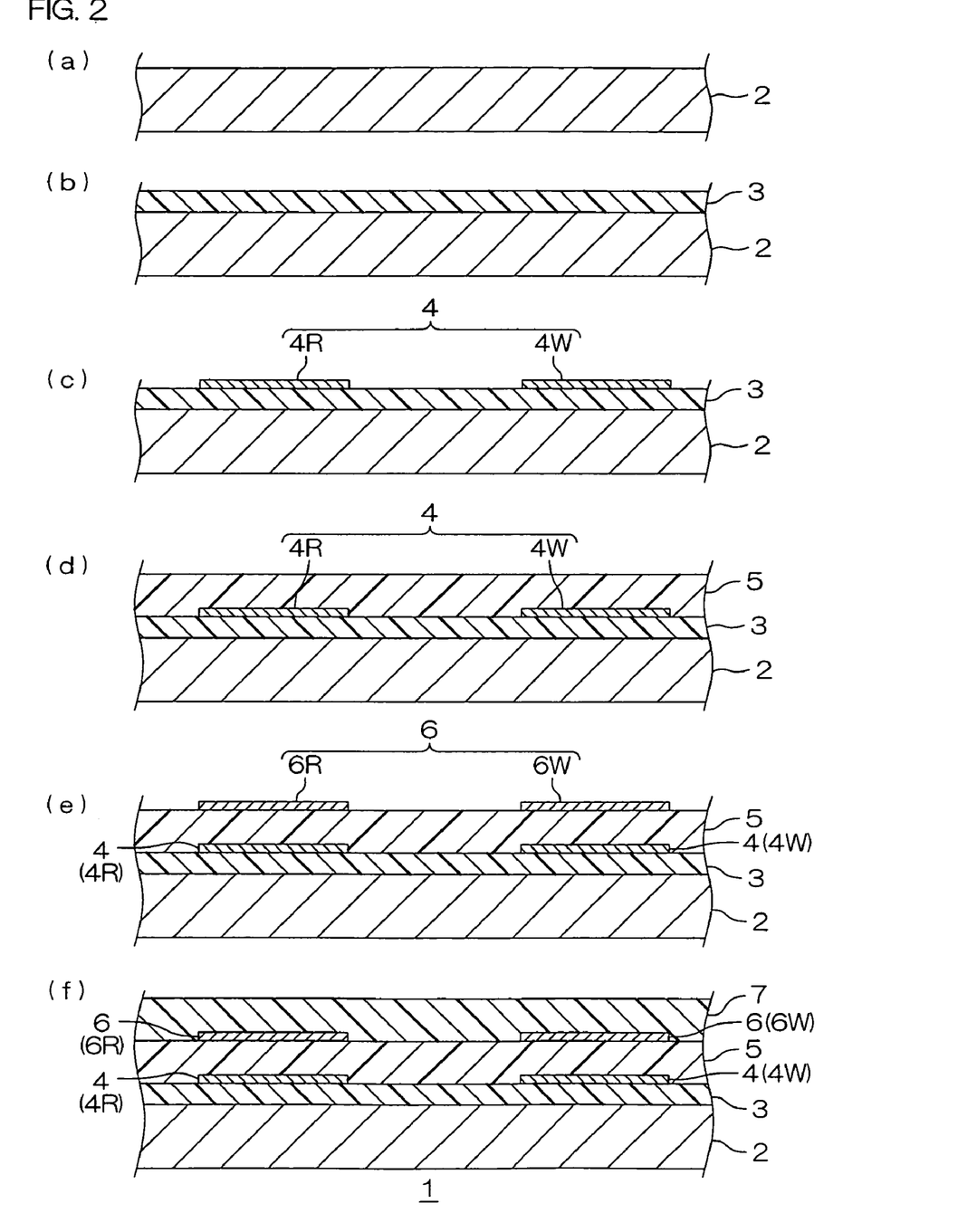
FIG. 2 is a process diagram illustrating the steps of producing the wired circuit board shown in FIG. 1, (a) showing the step of preparing a metal supporting board, (b) showing the step of forming an insulating base layer on the metal supporting board, (c) showing the step of forming first wires on the insulating base layer, (d) showing the step of forming an intermediate insulating layer on the insulating base layer, (e) showing the step of forming second wires on the intermediate insulating layer, and (f) showing the step of forming an insulating cover layer on the intermediate insulating layer.
Figure 3:
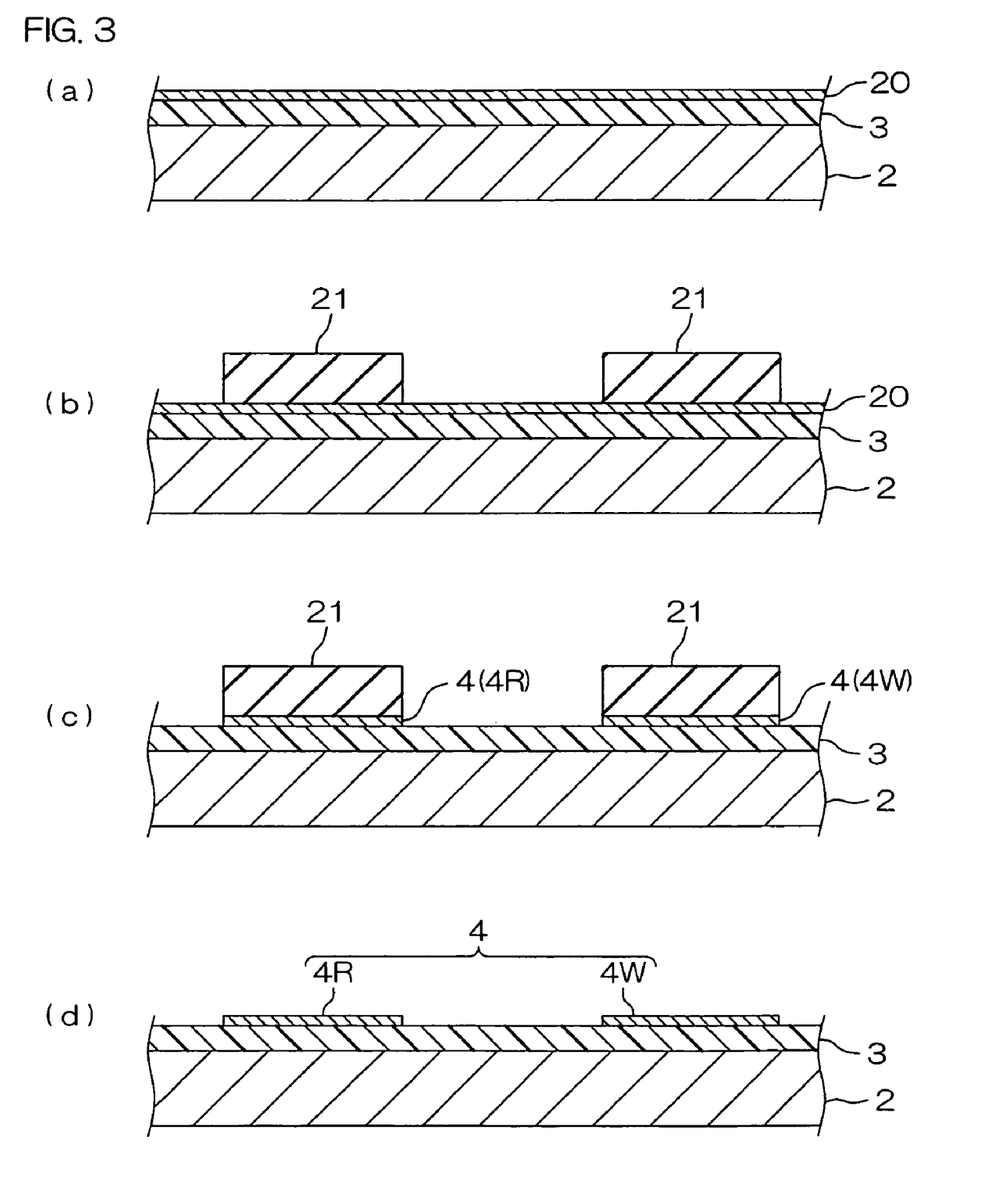
Figure 4:
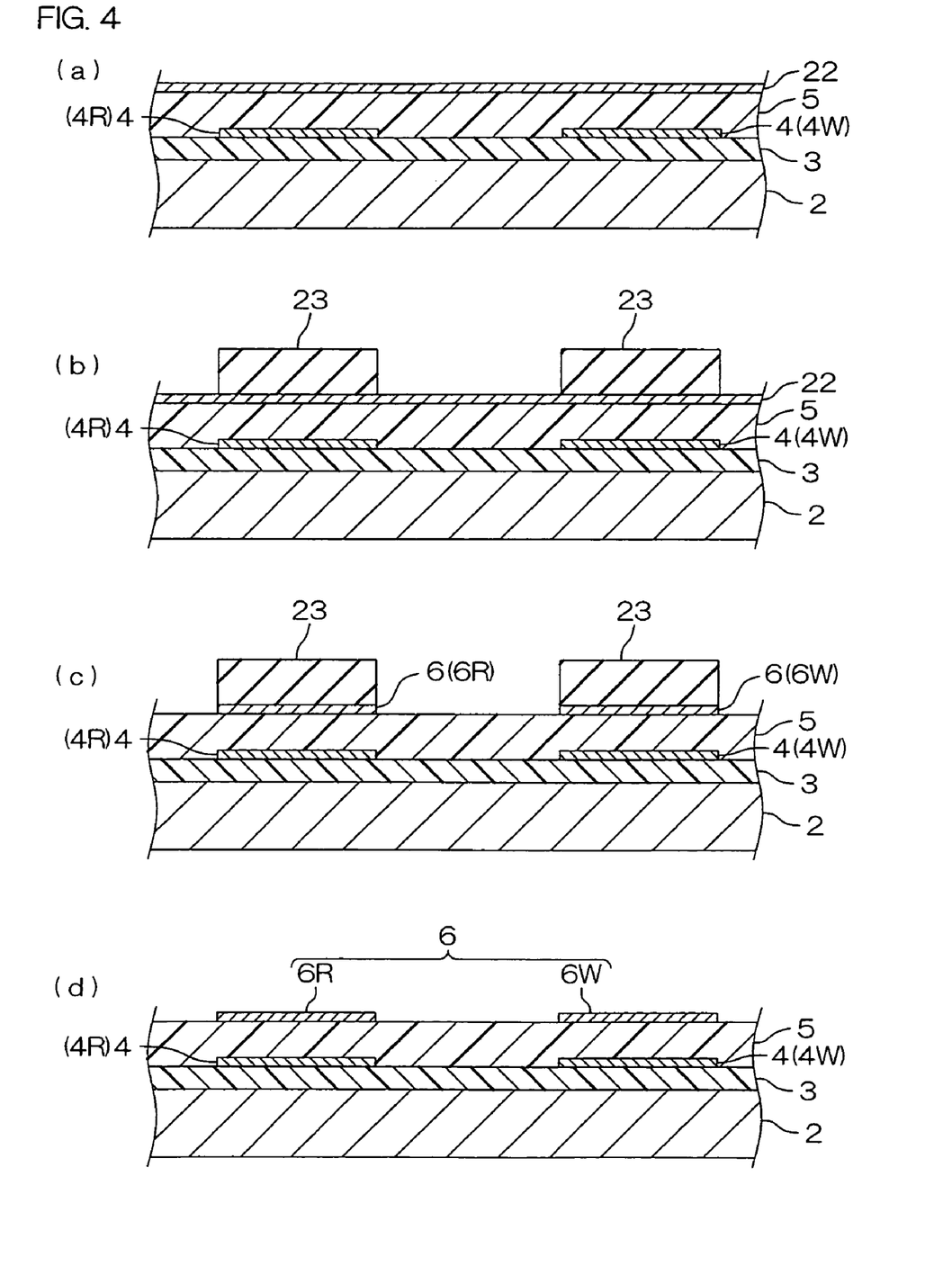
FIG. 4 is another process diagram for explaining the step (e) of forming second wires on the intermediate insulating layer, in the method for producing the suspension board with circuit shown in FIG. 2, (a) showing the step of forming a second conductive layer over the entire upper surface of the intermediate insulating layer, (b) showing the step of forming a second etching resist on the second conductive layer, (c) showing the step of etching the second conductive layer exposed from the second etching resist, and (d) showing the step of removing the second etching resist.

FIG. 1 is a sectional view illustrating a main portion of one embodiment of a wired circuit board according to the present invention; and FIGS. 2 to 4 are process diagrams illustrating the steps of producing the wired circuit board shown in FIG. 1.

In FIG. 1, the wired circuit board 1 is a suspension board with circuit mounted on a hard disk drive, and includes a metal supporting board 2 extending in the lengthwise direction and an insulating base layer 3 as a first insulating layer formed on the metal supporting board 2. The wired circuit board 1 includes a first wire 4 formed on the insulating base layer 3, an intermediate insulating layer 5 as a second insulating layer formed on the insulating base layer 3 so as to cover the first wire 4, a second wire 6 formed on the intermediate insulating layer 5, and an insulating cover layer 7 as an insulating layer formed on the intermediate insulating layer 5 so as to cover the second wire 6.

The metal supporting board 2 is made of a flat metal foil or a flat metal thin plate. The metal supporting board 2 has a thickness in the range of, for example, 10 to 30 µm, or preferably 15 to 25 µm.

The insulating base layer 3 is formed on a surface of the metal supporting board 2. More specifically, the insulating base layer 3 is formed over the entire upper surface of the metal supporting board 2 in the widthwise direction (the direction orthogonal to the lengthwise direction). The insulating base layer 3 has a thickness in the range of, for example, 6 to 15 µm, or preferably 8 to 12 µm.

A plurality (e.g., 2 pieces) of first wires 4 are formed on the surface of the insulating base layer 3 so as to extend along the lengthwise direction and so as to be spaced apart in parallel relation in the widthwise direction. Each of the first wires 4 is formed of a generally flat rectangular shape in sectional view. Both lengthwise ends of the respective first wires 4 are provided with first terminal portions which are not shown. The first wires 4 and the first terminal portions are continuously formed as a wired circuit pattern.

The first wires 4, as well as the second wires 6 described later, are each provided corresponding to a read wire and a write wire, and more specifically, the first wires 4 include a first read wire 4R and a first write wire 4W. The first read wire 4R is arranged on one widthwise side (left-hand side in FIG. 1) while the first write wire 4W is arranged in spaced relation to the first read wire 4R on the other widthwise side (right-hand side in FIG. 1).

The thickness (shown by T1 in FIG. 1) of the first wire 4 is 1 µm or less and is ⅓ or less of the thickness of the intermediate insulating layer 5 described later.

Specifically, when the thickness of the intermediate insulating layer 5 (the thickness from the surface of the insulating base layer 3 to the undersurface of the insulating cover layer 7; shown by T2 in FIG. 1) is set to 100%, the thickness T1 of the first wire 4 is set to 33.3% or less, preferably 10% or less, more preferably 5% or less, or even more preferably 1% or less, and usually 0.5% or more. More specifically, the thickness T1 of the first wire 4 is preferably 1 µm or less, more preferably 0.5 µm or less, or even more preferably 0.1 µm or less, and usually 0.05 µm or more.

The width of each of the first wires 4 (widthwise length; shown by W1 in FIG. 1) is set preferably shorter than the spacing between each of the first wires 4 (spacing in the widthwise direction, spacing between the first read wire 4R and the first write wire 4W; shown by W2 in FIG. 1), in other words, the spacing W2 between each of the first wires 4 is set preferably longer than the width W1 of each of the first wires 4.

Specifically, when the spacing W2 between each of the first wires 4 is set to 100%, the width W1 of the first wire 4 is in the range of, for example, 25 to 250%, or preferably 60% or more and less than 100. More specifically, the width W1 of the first wire 4 is in the range of, for example, 8 to 25 µm, or preferably 15 to 20 µm, and the spacing W2 between each of the first wires 4 is in the range of, for example, 10 to 30 µm, or preferably 20 to 25 µm.

Usually, when the spacing W2 between the first wires 4 is longer than the width W1 of the first wire 4, a level difference corresponding to each of the first wires 4 tends to be produced in the intermediate insulating layer 5. In the wired circuit board 1, since the thickness T1 of the first wire 4 is the above-specified thickness, and the thickness T1 of the first wire 4 and the thickness T2 of the intermediate insulating layer 5 have the above-specified relationship, the occurrence of the level difference can be prevented, thereby enabling the intermediate insulating layer 5 to be formed flat.

The intermediate insulating layer 5 covers the first wires 4 and the surface of the insulating base layer 3. More specifically, the intermediate insulating layer 5 is formed over the entire upper surface of the insulating base layer 3 including the first wires 4 in the widthwise direction.

The thickness T2 of the intermediate insulating layer 5 is set so that the thickness T1 of the first wire 4 is ⅓ or less than the thickness T2 of the intermediate insulating layer 5. In other words, the thickness T2 of the intermediate insulating layer 5 is set so as to be 3 or more times the thickness T1 of the first wire 4. More specifically, the thickness T2 of the intermediate insulating layer 5 is in the range of, for example, 1 to 10 µm, preferably 2 to 8 µm, more preferably 3 to 7 µm, or even more preferably 4 to 6 µm.

The second wire 6 is formed on the surface of the intermediate insulating layer 5 and is provided corresponding to the first wire 4. Specifically, a plurality (e.g., 2 pieces) of second wires 6 are provided so as to extend along the lengthwise direction and so as to be spaced apart in parallel relation in the widthwise direction, and each arranged in opposed relation to the respective first wires 4 upward in the thickness direction. Each of the second wires 6 is formed of a generally flat rectangular shape in sectional view. Both lengthwise ends of the respective second wires 6 are provided with second terminal portions which are not shown. The second wires 6 and the second terminal portions are continuously formed as a wired circuit pattern.

The second wires 6, as well as the first wires 4, are each provided corresponding to a read wire and a write wire, and more specifically, the second wires 6 include a second read wire 6R and a second write wire 6W. The second read wire 6R is arranged on one widthwise side (left-hand side in FIG. 1) while the second write wire 6W is arranged in spaced relation to the second read wire 6R on the other widthwise side (right-hand side in FIG. 1).

Thus, the second read wire 6R and the second write wire 6W are arranged in opposed relation to the first read wire 4R and the first write wire 4W, respectively, upward in the thickness direction.

The thickness of the second wire 6 is not particularly limited, and is set to be, for example, the same as the thickness T1 of the first wire 4. The width of the second wire 6 and the spacing between the second wires 6 are set to be, for example, the same as the width W1 of the first wire 4 and the spacing between the first wires 4, respectively.

The insulating cover layer 7 covers the second wires 6 and the surface of the intermediate insulating layer 5. More specifically, the insulating cover layer 7 is formed over the entire upper surface of the intermediate insulating layer 5 including the second wires 6 in the widthwise direction.

The thickness of the insulating cover layer 7 is not particularly limited, and is set to be, for example, the same as the thickness T2 of the intermediate insulating layer 5.

The wired circuit board 1 is provided as required with a first metal thin film formed on the surfaces of the first wires 4 and a second metal thin film formed on the surfaces of the second wires 6, though not shown. The first metal thin film and the second metal thin film, which are not shown, are made of metallic material such as nickel, each having a thickness in the range of, for example, 0.01 to 0.1 µm.

Next, a method for producing the wired circuit board 1 is described with reference to FIGS. 2 to 4.

In this method, a metal supporting board 2 is first prepared, as shown in FIG. 2(a). The metallic material that may be used to form the metal supporting board 2 includes, for example, stainless steel and 42-alloy, or preferably, stainless steel (e.g., SUS304, based on the AISI (American Iron and Steel Institute) standards).

Then, in this method, as shown in FIG. 2(b), the insulating base layer 3 is formed on the metal supporting board 2.

The insulating material that may be used to form the insulating base layer 3 includes, for example, synthetic resin such as polyimide, polyether nitrile, polyether sulfone, polyethylene terephthalate, polyethylene naphthalate, or polyvinyl chloride. Of these, preferably photosensitive synthetic resin, or more preferably, photosensitive polyimide is used.

The insulating base layer 3 is formed in the following manner. For example, a solution (varnish) of the above-mentioned synthetic resin is uniformly applied onto the entire upper surface of the metal supporting board 2, and then dried. Subsequently, the dried varnish is heated to be cured as required.

The insulating base layer 3 can also be formed as a pattern in the following manner. A solution (varnish) of a photosensitive synthetic resin is applied onto the entire upper surface of the metal supporting board 2 and then dried. Subsequently, the dried varnish is exposed to light and developed to be cured as required. Further, the method for forming the insulating base layer 3 is not limited to those described above, and for example, a synthetic resin is preliminarily formed into a film, and the film is adhesively bonded to a surface of the metal supporting board 2 via a known adhesive layer.

Then, in this method, as shown in FIG. 2(c), first wires 4 and first terminal portions (not shown) are formed on the insulating base layer 3 in the above-mentioned pattern.

The material that may be used to form the first wires 4 and the first terminal portions includes, for example, metallic material such as copper, nickel, gold, solder, or alloys thereof. Of these, copper is preferably used.

To form the first wires 4 and the first terminal portions, a known patterning method such as a subtractive method or an additive method is used. Preferably, a subtractive method is used.

The first wires 4 and the first terminal portions are formed by the subtractive method in the following manner. First, as shown in FIG. 3(a), a first conductive layer 20 is formed over the entire upper surface of the insulating base layer 3.

Examples of the method for forming the first conductive layer 20 include various film-forming methods such as physical vapor deposition (PVD), plating such as electroless plating, and a method of preliminarily forming a conductor into a film and adhesively bonding the film to the entire upper surface of the insulating base layer 3 via an adhesive layer as required. These film-forming methods can be used alone or in combination.

Preferably, physical vapor deposition is used. Physical vapor deposition enables the first conductive layer 20, which is formed into the first wires 4 and the first terminal portions in the subsequent step, to be easily formed so as to have the above-specified thickness.

The physical vapor deposition that may be used includes, for example, a sputtering method, a vacuum vapor deposition method, and an ion-plating method. Preferably, a sputtering method is used.

Then, in this method, as shown in FIG. 3(b), a first etching resist 21 having the same pattern as the wired circuit pattern for the first wires 4 and the first terminal portions is formed on the first conductive layer 20. The first etching resist 21 is formed by a known method such as laminating a dry film photoresist over the entire surface of the first conductive layer 20, exposing the photoresist to light, and developing it.

Then, in this method, as shown in FIG. 3(c), the first conductive layer 20 exposed from the first etching resist 21 is etched. As the etching, wet etching is performed by a dipping or spraying method, for example, using an aqueous ferric chloride solution as an etchant.

Subsequently, in this method, as shown in FIG. 3(d), the first etching resist 21 is removed by etching or peeling.

Thus, the first wires 4 and the first terminal portions can be formed by a subtractive method.

Alternatively, the first wires 4 and the first terminal portions are formed by an additive method in the following manner. For example, a seed layer made of copper, chromium, nickel, or alloys thereof is first formed over the entire upper surface of the insulating base layer 3 by a sputtering method, though not shown. The seed layer has a thickness in the range of 20 to 500 nm, or preferably 50 to 300 nm. A dry film resist is then provided on the surface of the seed layer, exposed to light, and developed to form a plating resist having a pattern reverse to the first wires 4 and the first terminal portions. Subsequently, the first wires 4 and the first terminal portions are formed as a wired circuit pattern on the surface of the seed layer exposed from the plating resist, by plating. Thereafter, the plating resist and the seed layer on a portion of which the plating resist is formed are removed.

Thus, as shown in FIG. 2(c), the first wires 4 and the first terminal portions are formed in the above-mentioned pattern.

Then, in this method, though not shown, a first metal thin film is formed on the surfaces of the first wires 4 as required. As a method for forming the first metal thin film, for example, plating or preferably electroless plating is used.

Then, in this method, as shown in FIG. 2(d), an intermediate insulating layer 5 is formed on the insulating base layer 3 so as to cover the first wires 4.

As insulating material for forming the intermediate insulating layer 5, the same insulating material as that used for the above-mentioned insulating base layer 3 is used.

The intermediate insulating layer 5 is formed in the following manner. For example, the solution (varnish) of the above-mentioned synthetic resin is uniformly applied onto the entire upper surface of the insulating base layer 3 including the first wires 4, and then dried. Subsequently, the dried varnish is heated to be cured as required.

The intermediate insulating layer 5 can also be formed as a pattern in the following manner. A solution (varnish) of a photosensitive synthetic resin is applied and then dried. Subsequently, the applied resin is exposed to light and developed to be cured as required. Further, the method for forming the intermediate insulating layer 5 is not limited to those described above, and for example, a synthetic resin is preliminarily formed into a film, and the film is adhesively bonded to the surface of the insulating base layer 3 including the first wires 4 via a known adhesive layer.

Then, in this method, as shown in FIG. 2(e), second wires 6 and second terminal portions (not shown) are formed on the intermediate insulating layer 5 in the above-mentioned pattern.

As the material for forming the second wires 6 and the second terminal portions, the same material as that used for the first wires 4 and the first terminal portions is used.

To form the second wires 6 and the second terminal portions, the same patterning method as that described above is used, or preferably a subtractive method is used.

The second wires 6 and the second terminal portions are formed by the subtractive method in the following manner. First, as shown in FIG. 4(a), a second conductive layer 22 is formed over the entire upper surface of the intermediate insulating layer 5. To form the second conductive layer 22, the same method as used to form the first conductive layer 20 as described above is used.

Then, in this method, as shown in FIG. 4(b), a second etching resist 23 having the same pattern as the wired circuit pattern for the second wires 6 and the second terminal portions is formed on the second conductive layer 22. To form the second etching resist 23, the same method as used to form the first etching resist 21 described above is used.

Then, in this method, as shown in FIG. 4(c), the second conductive layer 22 exposed from the second etching resist 23 is etched. To etch the second conductive layer 22, the same method as used to etch the first conductive layer 20 described above is used.

Then, in this method, as shown in FIG. 4(d), the second etching resist 23 is removed by the same method as used for the first etching resist 21.

Thus, the second wires 6 and the second terminal portions can be formed by a subtractive method.

Alternatively, to form the second wires 6 and the second terminal portions by an additive method, the same additive method as described above is used.

Thus, as shown in FIG. 2(e), the second wires 6 and the second terminal portions are formed in the above-mentioned pattern.

Then, in this method, though not shown, a second metal thin film is formed on the surfaces of the second wires 6 as required. As a method for forming the second metal thin film, the same method as used to form the first metal thin film is used.

Then, in this method, as shown in FIG. 2(f), an insulating cover layer 7 is formed on the intermediate insulating layer 5 so as to cover the second wires 6.

As insulating material for forming the insulating cover layer 7, the same insulating material as that used for the above-mentioned insulating base layer 3 is used.

The insulating cover layer 7 is formed in the following manner. For example, the solution (varnish) of the above-mentioned synthetic resin is uniformly applied onto the entire upper surface of the intermediate insulating layer 5 including the second wires 6, and then dried. Subsequently, the dried varnish is heated to be cured as required.

The insulating cover layer 7 can also be formed as a pattern in the following manner. A solution (varnish) of a photosensitive synthetic resin is applied and then dried. Subsequently, the applied resin is exposed to light and developed to be cured as required. Further, the method for forming the insulating cover layer 7 is not limited to those described above, and for example, a synthetic resin is preliminarily formed into a film, and the film is adhesively bonded to the surface of the intermediate insulating layer 5 including the second wires 6 via a known adhesive layer.

The metal supporting board 2 is then trimmed into a desired shape as required to obtain the wired circuit board 1.

The wired circuit board 1 thus obtained has a thickness (a total thickness of the respective layers) in the range of, for example, 18 to 65 μm, or preferably 27 to 63 μm; and the wired circuit board 1 excluding the metal supporting board 2 has a thickness (i.e., a total thickness of the insulating base layer 3, the first wires 4, the intermediate insulating layer 5, the second wires 6, and the insulating cover layer 7) in the range of, for example, 8 to 35 μm, or preferably 12 to 28 μm.

In this wired circuit board 1, since the thickness T1 of the first wire 4 is 1 μm or less, and is ⅓ or less of the thickness T2 of the intermediate insulating layer 5, the intermediate insulating layer 5 is formed flat but not formed thick. Therefore, the wired circuit board 1 can achieve a flat and thinner shape.

Further, the formation of the second wires 6 on the flat intermediate insulating layer 5 can improve the accuracy of the arrangement of the second wires 6. As a result, the first wires 4 and the second wires 6 can be accurately arranged in opposed relation to each other in the thickness direction, enabling the impedance thereof to be reliably stabilized.

Moreover, since the thickness of the second wire 6 is the same as the thickness T1 of the first wire 4, the insulating cover layer 7 is formed flat but not formed thick.

In the above explanation, the first wires 4 are formed of the first read wire 4R and the first write wire 4W while the second wires 6 are formed of the second read wire 6R and the second write wire 6W. However, the formation is not limited thereto, and for example, though not shown, the first wires 4 can be formed only of read wires (the first read wire 4R and a second read wire 4R'), while the second wires 6 can be formed only of write wires (the first write wire 4W and a second write wire 4W'). Alternatively, the first wires 4 can be formed only of write wires, the second wires 6 can be formed only of read wires.

In the above explanation, the wired circuit board of the present invention is exemplified as a suspension board with circuit including the metal supporting board 2. The wired circuit board of the present invention is, however, not limited thereto, and for example, though not shown, it can also be formed as a flexible wired circuit board not including the metal supporting board 2.

Figure 5:
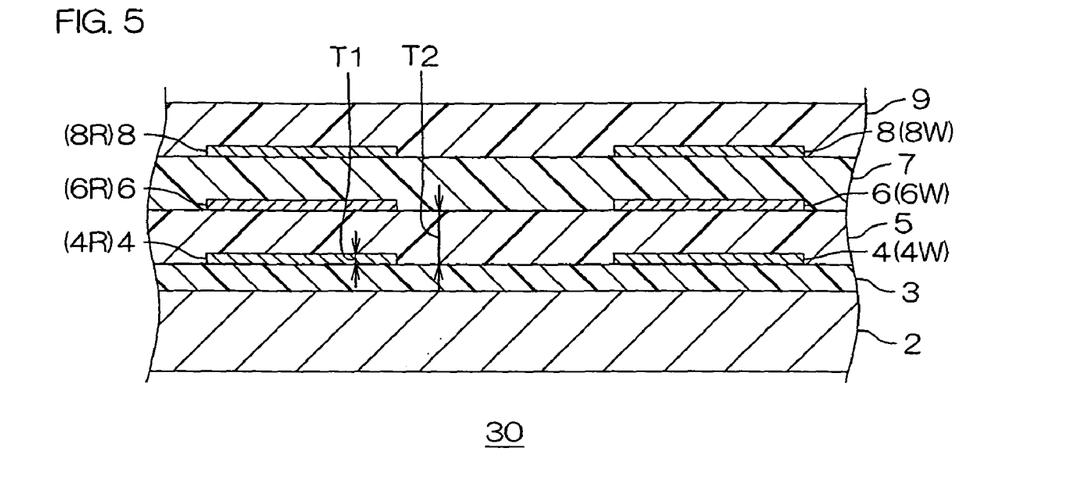
FIG. 5 is a sectional view illustrating a main portion of a multi-layered wired circuit board (a mode having a three-layered wired circuit pattern) as another embodiment of a wired circuit board according to the present invention.

FIG. 5 is a sectional view illustrating a main portion of a multi-layered wired circuit board (a mode including a three-layered wired circuit pattern) as another embodiment of a wired circuit board according to the present invention. The same reference numerals are provided in FIG. 5 for members corresponding to each of those described above, and their detailed description is omitted.

In the above explanation, the wired circuit board of the present invention is exemplified as a wired circuit board having a two-layered wired circuit pattern made of the first wires 4 and the second wires 6. The wired circuit board of the present invention is, however, not limited thereto, and for example, it can be formed as a multi-layered wired circuit board having a wired circuit pattern of three or more layers.

Specifically, as shown in FIG. 5, the wired circuit board of the present invention is formed as a multi-layered wired circuit board 30 in which third wires 8 are formed on the insulating cover layer 7 and a three-layered wired circuit pattern of the first wires 4, the second wires 6, and the third wires 8 is provided.

The multi-layered wired circuit board 30 is a suspension with a multi-layered circuit, and provided with a plurality of the third wires 8 (e.g., 2 pieces) in such a way that these wires are extended along the lengthwise direction and are spaced apart in parallel relation in the widthwise direction. The third wires 8 are arranged in opposed relation to the second wires 6 upward in the thickness direction. Each of the third wires 8 is formed of a generally flat rectangular shape in sectional view.

The multi-layered wired circuit board 30 includes a build-up layer 9 formed on the insulating cover layer 7 so as to cover the third wires 8. The thickness of the build-up layer 9 is set to be the same as that of the insulating cover layer 7.

Since the multi-layered wired circuit board 30 has the third wires 8 and the build-up layer 9 formed on the insulating cover layer 7, a level difference usually tends to occur in the build-up layer 9 of such multi-layered wired circuit board. In this multi-layered wired circuit board 30, however, the first wires 4, the second wires 6, and the third wires 8 each have the above-specified thickness and the thickness T1 of the first wire 4 and the thickness T2 of the intermediate insulating layer 5 have the above-specified relation, so that the occurrence of the level difference in the build-up layer 9 can be prevented, thereby enabling the build-up layer 9 to be formed flat. Therefore, the multi-layered wired circuit board 30 can be formed flat.

Example

While in the following, the present invention is described in further detail with reference to Examples and Comparative Examples, the present invention is not limited to any of them.

Example 1

First, a metal supporting board made of a 25 μm-thick stainless steel (SUS304) foil was prepared (cf. FIG. 2(*a*)). A varnish of a photosensitive polyamic acid resin was then applied to the entire upper surface of the metal supporting board and then dried. Thereafter, the dried varnish was exposed to light and developed, and the obtained product was further heated to be cured, so that a 10 μm-thick insulating base layer made of polyimide was formed (cf. FIG. 2(*b*)).

Subsequently, first wires and first terminal portions were formed on the insulating base layer by the subtractive method (cf. FIG. 2(*c*)).

In the subtractive method, first, a 0.1 μm-thick first conductive layer made of copper was formed over the entire upper surface of the insulating base layer by the sputtering method (cf. FIG. 3(*a*)).

Then, a dry film photoresist was laminated over the entire surface of the first conductive layer. Thereafter, the laminated product was exposed to light and developed, so that a first etching resist having the same pattern as the wired circuit pattern including the first wires and the first terminal portions was formed on the first conductive layer (cf. FIG. 3(*b*)).

The first conductive layer exposed from the first etching resist was then subjected to wet etching using an aqueous mixed solution of nitric acid and hydrogen peroxide (cf. FIG. 3(*c*)).

Subsequently, the first etching resist was removed by etching (cf. FIG. 3(*d*)).

The respective first wires had a thickness of 0.1 μm and a width of 20 μm, and a spacing between each of the first wires was 25 μm.

Thereafter, a 0.1 μm-thick first metal thin film made of nickel was formed on the surfaces of the first wires by electroless plating.

A varnish of a photosensitive polyamic acid resin was then applied to the entire upper surface of the insulating base layer including the first wires (and the first metal thin film) and then dried. Thereafter, the dried varnish was exposed to light and developed, and the obtained product was further heated to be cured, so that a 5 μm-thick intermediate insulating layer made of polyimide was formed (cf. FIG. 2(*d*)).

Subsequently, second wires and second terminal portions were formed on the intermediate insulating layer by the subtractive method (cf. FIG. 2(*e*)).

In the subtractive method, first, a 0.1 μm-thick second conductive layer made of copper was formed over the entire upper surface of the intermediate insulating layer by the sputtering method (cf. FIG. 4(*a*)).

Then, a dry film photoresist was laminated over the entire surface of the second conductive layer. Thereafter, the laminated product was exposed to light and developed, so that a second etching resist having the same pattern as the wired circuit pattern including the second wires and the second terminal portions was formed on the second conductive layer (cf. FIG. 4(*b*)).

The second conductive layer exposed from the second etching resist was then subjected to wet etching using an aqueous ferric chloride solution (cf. FIG. 9(*c*)).

Subsequently, the second etching resist was removed by etching (cf. FIG. 4(*d*)).

The respective second wires had a thickness of 0.1 μm and a width of 20 μm, and a spacing between each of the second wires was 25 μm. The second wires were arranged so as to be opposed to the first wires in the thickness direction.

Thereafter, a 0.1 μm-thick second metal thin film made of nickel was formed on the surfaces of the second wires by electroless plating.

A varnish of a photosensitive polyamic acid resin was then applied to the entire upper surface of the intermediate insulating layer including the second wires (and the second metal thin film) and then dried. Thereafter, the dried varnish was exposed to light and developed, and the obtained product was further heated to be cured, so that a 5 μm-thick insulating cover layer made of polyimide was formed (cf. FIG. 1 and FIG. 2(f)). Thereafter, the metal supporting board was cut out into a desired shape by etching to obtain a suspension board with circuit.

Example 2

The suspension board with circuit was obtained in the same manner as in Example 1 except that the thickness of the first wire and that of the second wire were changed to 1 μm.

Example 3

The suspension board with circuit was obtained in the same manner as in Example 1 except that the spacing between each of the first wires and the width of each of the first wires were changed to the same length, i.e., 25 μm, and the spacing between each of the second wires and the width of each of the second wires were changed to the same length, i.e., 25 μm.

Comparative Example 1

The suspension board with circuit was obtained in the same manner as in Example 1 except that the thickness of the first wire and that of the second wire were changed to 2 μm.

Comparative Example 2

The thickness of the first wire and that of the second wire were changed to 1 μm, and the thickness of the intermediate insulating layer and that of the insulating cover layer were changed to 2 μm. In other words, the thickness of the first wire and that of the second wire were changed to ½ of the thickness of the intermediate insulating layer and ½ of that of the insulating cover layer, respectively.
(Evaluation)
1) Surface Observation The surfaces of the suspension board with circuits in Examples 1 to 3 and Comparative Examples 1 and 2 were observed under SEM.

The results showed that the surfaces thereof in Examples 1 and 2 were flat, and the surface thereof in Example 3 was nearly flat although slightly uneven.

Figure 6:
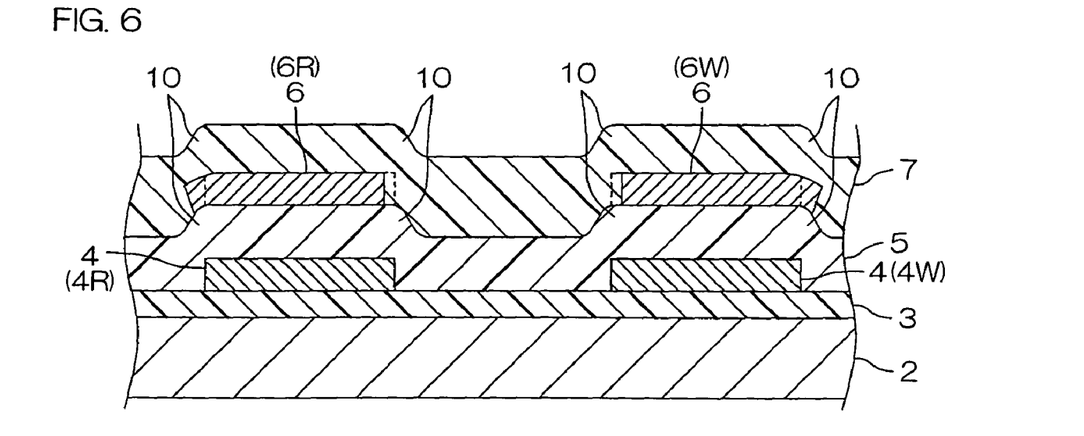
FIG. 6 is a sectional view illustrating a main portion of the suspension board with circuit in Comparative Examples 1 and 2.

On the other hand, the results confirmed that, in Comparative Examples 1 and 2, as shown in FIG. 6, the surfaces thereof were uneven due to the first wires and the second wires.
2) Measurement of Thickness The thicknesses of the suspension boards with circuit in Examples 1 to 3 and Comparative Examples 1 and 2 were measured with a linear gauge.

The results showed that the thickness thereof in Example 1 was 45 μm; in Example 2, 47 μm; in Example 3, 45 μm; in Comparative Example 1, 45 μm; and in Comparative Example 2, 41 μm.
3) Observation under SEM The suspension boards with circuit in Examples 1 to 3 and Comparative Examples 1 and 2 were cut along the widthwise direction by mechanical polishing, and the cut surface (widthwise section) thereof was observed under SEM (scanning electron microscope).

The results confirmed that, in Examples 1 to 3, the second wires were not misaligned, and the second wires and the first wires were arranged in the same position in the thickness direction in plane view.

On the other hand, it was confirmed that, in Comparative Examples 1 and 2, as shown in FIG. 6, the second wires were misaligned (i.e., misaligned from their original forming positions (phantom lines) to the actual forming positions (solid lines)).

In Comparative Examples 1 and 2, as shown in FIG. 6, there were level differences (10) produced in the intermediate insulating layer and the insulating cover layer.
4) Characteristic Impedance In the suspension boards with circuit in Examples 1 to 3 and Comparative Examples 1 and 2, the variation of the characteristic impedance of the first wires and the second wires was measured with TDR (Time Domain Reflectometry).

The results showed that the characteristic impedance variation in Examples 1 to 3 was 5Ω, and that in Comparative Examples 1 and 2 was 15 Ω.

The thickness of the first wires, the thickness of the intermediate insulating layers, the spacing between each of the first wires, the width of each of the first wires, and the evaluation results in the suspension boards with circuit in Examples 1 to 3 and Comparative Examples 1 and 2 are shown in Table 1.

TABLE 1

| | | Ex./Comp. Ex. | | | | |
|---|---|---|---|---|---|---|
| | | Ex. 1 | Ex. 2 | Ex. 3 | Comp. Ex. 1 | Comp. Ex. 2 |
| Thickness of First Wire (μm) | | 0.1 | 1 | 0.1 | 2 | 1 |
| Thickness of Intermediate Insulating Layer (μm) | | 5 | 5 | 5 | 5 | 2 |
| Spacing Between First Wires (μm) | | 25 | 25 | 25 | 20 | 20 |
| Width of First Wire (μm) | | 20 | 20 | 25 | 20 | 20 |
| Evaluation | Surface Observation | Flat | Flat | Nearly Flat | Uneven | Uneven |
| | Measurement of Thickness (μm) | 45 | 47 | 45 | 45 | 41 |
| | Observation under SEM   Second Wire | — | — | — | Misaligned | Misaligned |
| | Intermediate Insulating Layer Insulating Cover Layer | — | — | — | Level difference exists. | Level difference exists. |
| | Characteristic Impedance Variation (Ω) | 5 | 5 | 5 | 15 | 15 |

While the illustrative embodiments of the present invention are provided in the above description, such is for illustrative purpose only and it is not to be construed limitative. Modification and variation of the present invention that will be obvious to those skilled in the art is to be covered by the following claims.

What is claimed is:

1. A wired circuit board comprising:
   a metal supporting board;
   a first insulating layer formed on top of the metal supporting board;

at least one first wire formed on top of the first insulating layer;

a second insulating layer formed on top of the first insulating layer so as to cover the at least one first wire, the second insulating layer being separate and distinct from the first insulating layer; and at least one second wire formed on top of the second insulating layer so as to be arranged in opposed relation to and aligned with the at least one first wire in a thickness direction, wherein the thickness of the at least one first wire is 1 μm or less and is ⅓ or less of the thickness of the second insulating layer.

2. The wired circuit board according to claim 1, wherein the at least one first wire comprises a plurality of first wires, wherein the first wires are provided so as to be spaced apart in parallel relation, and wherein a spacing between each of the first wires is longer than a width of each of the first wires.

3. The wired circuit board according to claim 1, wherein the at least one first wire is formed by physical vapor deposition.

4. The wired circuit board according to claim 1, further comprising:

at least one insulating layer formed on the second insulating layer so as to cover the at least one second wire; and at least one further wire formed on the at least one insulating layer, wherein the at least one further wire is arranged in opposed relation to the at least one second wire in a thickness direction.

5. The wired circuit board according to claim 1, wherein the first insulating layer and the second insulating layer are made of a synthetic resin material.

* * * * *